United States Patent
Xie et al.

(10) Patent No.: US 8,349,746 B2
(45) Date of Patent: Jan. 8, 2013

(54) MICROELECTRONIC STRUCTURE INCLUDING A LOW K DIELECTRIC AND A METHOD OF CONTROLLING CARBON DISTRIBUTION IN THE STRUCTURE

(75) Inventors: Bo Xie, Sunnyvale, CA (US); Alexandros T. Demos, Fremont, CA (US); Daemian Raj, San Jose, CA (US); Sure Ngo, Dublin, CA (US); Kang Sub Yim, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 150 days.

(21) Appl. No.: 12/660,294

(22) Filed: Feb. 23, 2010

(65) Prior Publication Data
US 2011/0204492 A1 Aug. 25, 2011

(51) Int. Cl.
*H01L 21/469* (2006.01)
(52) U.S. Cl. ........ 438/787; 257/635; 257/632; 257/751; 257/E21.277; 257/E23.002; 438/761; 438/783; 438/643; 438/786; 438/778
(58) Field of Classification Search .................. 257/635, 257/632, 751, E21.277, E23.002; 438/643, 438/761, 438, 287, 778–780
See application file for complete search history.

(56) References Cited

U.S. PATENT DOCUMENTS

| | | | |
|---|---|---|---|
| 6,455,417 B1 | 9/2002 | Bao et al. ................ | 438/637 |
| 7,151,053 B2 | 12/2006 | Lee et al. ................ | 438/631 |
| 7,169,715 B2 | 1/2007 | Ott et al. ................ | 438/780 |
| 7,189,658 B2 | 3/2007 | Lakshmanan et al. ........ | 438/758 |
| 7,259,111 B2 * | 8/2007 | Padhi et al. ................ | 438/787 |
| 7,297,376 B1 | 11/2007 | Yim et al. ................ | 427/578 |
| 7,342,295 B2 | 3/2008 | Xu et al. ................ | 257/618 |
| 7,384,471 B2 | 6/2008 | Vrtis et al. ................ | 106/287.14 |
| 7,611,996 B2 | 11/2009 | Schmitt et al. ................ | 438/759 |
| 7,615,482 B2 | 11/2009 | Edelstein et al. ................ | 438/627 |
| 7,622,403 B2 | 11/2009 | Yudhistira et al. ................ | 438/795 |
| 2002/0016085 A1 | 2/2002 | Huang et al. ................ | 438/798 |
| 2002/0172766 A1 | 11/2002 | Laxman et al. ................ | 427/255.28 |
| 2003/0064154 A1 | 4/2003 | Laxman et al. ................ | 427/255.28 |
| 2005/0038276 A1 | 2/2005 | Laxman et al. ................ | 556/436 |
| 2006/0264033 A1 | 11/2006 | Olmen et al. ................ | 438/637 |
| 2007/0134435 A1 | 6/2007 | Ahn et al. ................ | 427/515 |
| 2008/0233366 A1 * | 9/2008 | Edelstein et al. ................ | 428/201 |
| 2009/0026587 A1 * | 1/2009 | Angyal et al. ................ | 257/632 |
| 2009/0239390 A1 | 9/2009 | Wu et al. ................ | 438/780 |

* cited by examiner

Primary Examiner — Thao Le
Assistant Examiner — Sheng Zhu
(74) Attorney, Agent, or Firm — Shirley L. Church Esq.

(57) ABSTRACT

Embodiments of the present invention pertain to the formation of microelectronic structures. Low k dielectric materials need to exhibit a dielectric constant of less than about 2.6 for the next technology node of 32 nm. The present invention enables the formation of semiconductor devices which make use of such low k dielectric materials while providing an improved flexural and shear strength integrity of the microelectronic structure as a whole.

8 Claims, 8 Drawing Sheets

MICROELECTRONIC STRUCTURE INCLUDING A LOW K DIELECTRIC AND A METHOD OF CONTROLLING CARBON DISTRIBUTION IN THE STRUCTURE

The present application is related to a microelectronics fabrication method used to control the adhesion between a barrier layer and an overlying low k dielectric layer. Related patents and applications which have an inventor in common with the present application include U.S. Pat. No. 7,151,053 B2, to Lee et al. issued Dec. 19, 2006, entitled: "Method Of Depositing Dielectric Materials Including Oxygen-Doped Silicon Carbide In Damascene Applications; "U.S. Pat. No. 7,189,658 B2, to Lakshmanan et al. issued Mar. 13, 2007, entitled: "Strengthening The Interface Between Dielectric Layers And Barrier Layers With An Oxide Layer Of Varying Composition Profile"; U.S. Pat. No. 7,297,376 B1 to Yim et al. issued Nov. 20, 2997, entitled: "Method To Reduce Gas-Phase Reactions In A PECVD Process With Silicon And Organic Precursors To Deposit Defect-Free Initial Layers"; U.S. Pat. No. 7,611,996 B2 to Schmitt et al. issued Nov. 3, 2009, entitled: "Multi-Stage Curing Of Low k Nano-Porous Films"; and, U.S. Pat. No. 7,615,482 to Edelstein et al. issued Nov. 10, 2009, entitled: "Structure and Method For Porous SiCOH Dielectric Layers And Adhesion Promoting Or Etch Stop Layers Having Increased Interfacial And Mechanical Strength". While no priority is claimed under any of these related patents and applications, the subject matter present in these patents and applications is hereby incorporated by reference, to the extent they are not incompatible with the teachings of the invention herein.

BACKGROUND

1. Field

A number of low k materials which meet the microelectronics industry dielectric constant requirements contain carbon and are deposited by plasma enhanced chemical vapor deposition (PECVD). The carbon containing low k dielectrics need to have a uniform carbon distribution. In addition, the presence of carbon affects the adhesion between a low k dielectric layer and an underlying or overlying diffusion barrier layer.

2. Description of the Background Art

This section describes background subject matter related to the disclosed embodiments of the present invention. There is no intention, either express or implied, that the background art discussed in this section legally constitutes prior art.

The next generation of semiconductor devices will be the 32 nm "technology node". This small feature size requires that each layer of material which forms a part of the device structure be able to perform its function in a smaller space than was previously available. As a result, during the deposition of very thin layers (350 Å or less) of material which make up the device, abrupt changes in material compositions and structures may occur which have undesirable effects, (causing problems in the device function). For example, a layer of low k material is applied for purposes of providing an electrically insulating function, but just enough to control electrical signal transfer while not slowing the functioning of the device as a whole. A number of low k materials have been developed in recent years, and frequently these materials are used in contact with a surface of a diffusion barrier layer which prevents migration of conductive materials into adjacent semiconductor or dielectric layers.

It is important that there be good adhesion between the low k dielectric layer and the diffusion barrier layer. This is important for device performance integrity. It is also important during fabrication of the devices, because the most commonly used processes for creating "multi-layer metal" devices (i.e. multi-layered connectivity devices which are useful in reducing device size) are damascene processes which make use of flattening, milling processes such as chemical mechanical polishing. These milling processes create stress at interfaces between layers present in the device structure at the time of milling.

The stresses created between device layers during a process such as chemical mechanical polishing (CMP) can deform the device, separate interfacial surfaces, and cause performance defects.

Low k dielectric materials which have been developed in recent years and the manner in which these materials are used are described in the related patents and applications previously referred to herein, as well as others mentioned below, for example. This is not an all inclusive list of the background art, but hopefully provides a general understanding of the technology which is improved upon by the present invention.

U.S. Pat. No. 6,455,417 to Bao et al., issued Sep. 24, 2002, titled: "Method for Forming Damascene Structure Employing Bi-layer Carbon doped Silicon Nitride/Carbon Doped Silicon Oxide Etch Stop Layer", describes a damascene method for forming a microelectronic structure, which employs a first etch stop/liner layer formed on a substrate, where the first etch stop/liner layer comprises a carbon doped silicon nitride material and a second layer formed upon the first layer, where the second layer is a carbon doped silicon oxide dielectric material. (Abstract) In a preferred embodiment of the Bao et al. structure, both the carbon doped silicon nitride material and the carbon doped silicon oxide material are formed by employing a PECVD method. Typically the starting precursors used in the PECVD process include an organosilane as a silicon and carbon source material. The organosilane material may be reacted with nitrogen source material such as nitrogen, ammonia, or hydrazine, for example to form the carbon doped silicon nitride. The organosilane material may be reacted with an oxygen source material such as oxygen, ozone, nitrous oxide, nitric oxide, carbon monoxide, and carbon dioxide to form a carbon doped silicon oxide.

Schmitt et al. U.S. Pat. No. 7,611,996 B2 describes the deposition of low k dielectric layers using chemical vapor deposition (CVD), and preferably plasma enhanced CVD (PECVD), so that reactant gases used to produce depositing films can be excited by the plasma and a lower temperature is required for film deposition. A discussion of various CVD deposited films and their function includes the consideration that as devices get smaller, the contribution of resistivity from structures of multiple layered films increases, slowing down the performance of a device. In addition, smaller device geometries result in an increase in parasitic capacitance between devices. Parasitic capacitance between metal interconnects on the same or adjacent layers in a circuit can result in crosstalk between the metal lines or interconnects and/or resistance-capacitance (RC) delay, thereby reducing the response time of the device and degrading the overall performance of the device. The problem becomes worse as the number of levels of metal interconnects is increased.

To reduce the parasitic capacitance between metal interconnects on the same or adjacent layers, it has been necessary to change the low k dielectric material used between the metal lines or interconnects to a material having an increasingly lower dielectric constant. A dielectric constant below 2.5 is mentioned as desirable in the Schmitt et al. patent. The material developed to obtain this dielectric constant was a nano-porous silicon oxide film having dispersed microscopic gas voids. This low k dielectric material is said to be typically deposited over the surface of a barrier layer which is comprised of a PECVD silicon oxide, silicon nitride, silicon oxynitride, or hydrogenated silicon carbide.

The Lee et al. patent (U.S. Pat. No. 7,151,053 B2) describes a method of depositing a barrier layer on a substrate by reacting a gas comprising an oxygen-containing organosilicon compound, a compound comprising oxygen and carbon, and an oxygen-free organosilicon compound, where the resulting film deposited is an oxygen-doped silicon carbide layer having an oxygen content of about 15 atomic % or less. In another embodiment, the reactants include a compound comprising oxygen and carbon and an oxygen-free organosilicon compound, which can also be used to produce an oxygen-doped silicon carbide layer having an oxygen content of about 15 atomic % or less.

The development of silicon oxycarbide films having both a low dielectric constant and desirable chemical and mechanical properties has turned out to be challenging. It has been observed that silicon oxycarbide films which have a desirably low dielectric constant of less than 2.5 often do not adhere well to an underlying barrier layer, such as a silicon and carbon-containing barrier layer. Embodiments of the invention described in the Lakshmanan et al. patent (U.S. Pat. No. 7,189,658 B2) describe a method of depositing a low k dielectric layer, where the low k dielectric layer is deposited in a manner such that there is an oxygen concentration gradient within the deposited layer. The underlying barrier layer may be a silicon carbide, nitrogen-doped silicon carbide, oxygen-doped silicon carbide, or oxygen and nitrogen-doped silicon carbide layer. The low k dielectric layer deposited over the barrier layer is formed using a PECVD process in which the processing gas feed comprises an organosilicon compound and an oxidizing gas, where the flow rate of the organosilicon compound is increased as the deposition progresses. This provides a higher oxygen content and a lower carbon content at the interface between the barrier layer and the low k dielectric layer.

The concept of producing a series of layers to create microelectronic structure having desired properties within a PECVD processing chamber is also described in the Edelstein et al. patent (U.S. Pat. No. 7,615,482). A method is disclosed in which a starting substrate surface is a layer of dielectric or conductive material. A layer of oxide (silicon oxide) is formed on the substrate surface, where the oxide layer contains essentially no carbon. A graded transition layer is then formed over the oxide layer, where the graded transition layer has essentially no carbon at the interface with the oxide layer and gradually increases in carbon content towards a porous SiCOH layer, which forms the upper portion of the low dielectric constant layer. The precursor material used to produce the SiCOH layer is said to be ramped up while the oxygen concentration in the PECVD feed gas is ramped down.

As discussed with reference to FIGS. 2 and 3 of the Edelstein et al. patent, there are likely problems with adhesion between the various layers which have different chemical compositions. For purposes of illustration, please see FIG. 1 of the present application, which illustrates a renumbered Edelstein et al. example for a two metallization layer structure. One of skill in the art will recognize that there may be up to 7 or more metallization layers, depending on the device structure. In FIG. 1A, the semiconductor structure 100 includes a semiconductor material 102 which underlies a low k dielectric layer 104 which contains a metal line 106. Overlying metal line 106 is a capping layer 110, which may be a silicon carbide material such as SiCH or SiCHN, as described in the Edelstein et al. patent. Overlying capping layer 110 is an interfacial structure 112, which is said to be made up of two layers 112a and 112b, as illustrated in more detail in FIG. 1B.

Layer 112a is said to be an oxide layer having essentially no carbon, where "essentially" is defined as ranging from 0.1 to 3 atomic percent carbon. A carbon content of this amount is said not to adversely affect the performance of the oxide layer 112a. Layer 112b is said to be a transition layer, which transitions from an oxide layer having essentially no carbon to a porous SiCOH layer. Overlying the surface of layer 112b is a homogeneous low k dielectric layer of SiCOH which is shown as layer 114. The low k dielectric layer 114 is equivalent to the low k dielectric layer 104. A connective contact via 108 containing a conductive fill material 108 is surrounded by low k dielectric layer 104. A second level metal line 116 is in contact with the conductive material present in connective via 108.

Overlying second metal line 116 is a second capping layer 120, which may be a silicon carbide material such as SiCH or SiCHN, as described in the Edelstein et al. patent. Overlying second capping layer 120 is a second interfacial structure 122, which is made up of two layers (not shown) which would be the equivalent of layers 112a and 112b which are shown in FIG. 1B. A second level contact via 118 filled with conductive material makes the connection with the second metal line 116, and may connect to additional layers of metallization which are not shown above second level via 118. A third homogeneous low k dielectric layer 124 of SiCOH surrounds contact via 118.

As discussed in the Edelstein et al. patent, the problem with the structure shown in prior art FIGS. 1A and 1B (of the present application) is said to be that adhesion tends to be inadequate between the SiCOH layer (104, 114, and 124) and the underlying layer, which may be a semiconductor material 102 (such as silicon, for example) or may be a capping (barrier) material layer (112 and 122) which has typically been a silicon carbide-based material. The transition layer, shown as 112b in prior art FIG. 1B (shown in the present application) is intended to improve the adhesion between layer 112b and underling layer 112a, which is the silicon oxide layer which contains essentially no carbon. Further, layer 112a is said to have been demonstrated to bond well to the surface of the low k dielectric SiCOH layer (104, 114 and 124).

In the Edelstein et al. patent, the key to deposition of the transition layer (shown as 112b in the present application prior art FIG. 1B) is said to be that there is a smooth transition in the amount of carbon present in the depositing film as the amount of carbon is increased. However, finding a method of achieving this smooth transition has been somewhat elusive. For example, the Edelstein et al., patent teaches that the feed of reactive precursors shown in FIG. 5 of the Edelstein et al. patent results in a large carbon peak in the carbon graded transition layer formed, eventually resulting in a mechanically weak interfacial layer with the underlying surface. To solve this problem, a different introduction schedule of the reactants into the chamber, of the kind shown in Edelstein et al. FIG. 6 was used. This was said to still result in a carbon peak and an oxygen dip during film deposition, both of which lead to a mechanically weak interfacial layer at the underlying surface. Finally, a revised introduction schedule of reactants into the chamber, of the kind shown in Edelstein et al. FIG. 7 (prior art FIG. 2 of the present application) is said to provide a transition layer in which both carbon and porosity gradually and uniformly increase.

As mentioned above, prior art FIG. 2 of the present application shows the Edelstein et al FIG. 7. FIG. 200 is a graph showing relative flow rates for various precursor materials on axis 204 and a time period related to the PECVD film deposition process at which the flow is taking place on axis 202. The actual flow rates are not specified in the Edelstein disclosure. The time periods are specified, where T1 is said to range from 1-4 seconds, T2 is said to range from 2-4 seconds, T3 is said to be greater than T2. T4 is described as the time when all flows are stabilized at values to deposit the porous SiCOH low k dielectric film. T4 is said to typically range from 10 seconds to 200 seconds. Curve 206 represents a porogen (one of the kinds known in the art) precursor flow, the precise composition of which is not defined in the Edelstein et al. patent. Curve 208 represents oxygen flow, and Curve 210 represents the SiCOH low k dielectric precursor flow. The low k dielectric precursor materials are not specifically described. T2 is said to be the time at which the dielectric precursor flow is stable. The porogen precursor is said to be introduced during the T1-T2 interval. T3 is said to be the time at which the porogen precursor flow is stable. The ramp up rate of the porogen precursor may be lower than the ramp up rate of the dielectric precursor, as is shown in the present prior art FIG. 2. The interval between T2 and T3 is said to be preferably as short as possible.

Despite all of this effort, the adhesion between barrier layers and low k dielectric layers has continued to cause problems with respect to the structural stability of the overall multi metal layer structures which include low k dielectric layers. The present invention provides an improvement over the prior art described above, by providing an improved device structure which inherently solves many of the prior art problems. While the present invention makes use of many of the same precursor materials as those described in the art, the manner in which the materials are applied is different, and this provides the improved device structure.

SUMMARY

As the feature sizes for semiconductor devices become ever smaller, with the next design node being 32 nm, control over the chemical composition and thickness of the materials deposited, as well as the resultant overall structural stability of the device becomes challenging. The focus of embodiments of the present invention pertain to controlling the dielectric constant of the dielectric materials to be less than 2.6, and preferably less than 2.5. Simultaneously, the method of the invention provides good flexural and tensile strength throughout the most challenging areas of the device structure, where the improvement in adhesive strength across the structure may be measured using a 4-point bend test of the kind which is currently used in the art to evaluate microelectronic structures.

In a general embodiment of the present invention, there is a semiconductor device structure which employs at least one carbon doped low k diffusion barrier material area which comprises carbon at a concentration ranging from greater than 3 atomic % up to about 12 atomic %. Overlying the diffusion barrier material is a first transitioning area which comprises silicon oxide which comprises carbon at a concentration which is 3 atomic % or lower. Overlying the first transitioning area is a second transitioning area which comprises silicon oxide having a carbon concentration which increases from 3 atomic % up to the carbon concentration of an overlying area of porous carbon doped silicon oxide low k dielectric material. Typically the carbon concentration in the carbon doped silicon oxide low k dielectric material is less than about 12 atomic %. This multi-layered structure may be present several times within a microelectronics device, and is present when a carbon-doped low k diffusion barrier or other diffusion barrier is present. The inventive device structure is used to assist in providing adhesive strength across the structure when a carbon doped low k diffusion barrier material is applied subsequently to (overlying) a diffusion barrier material which has poor adhesive strength with respect to the diffusion barrier material.

With reference to FIG. 3, to facilitate a better understanding of the concepts involved, the first transitioning area, which is a silicon oxide comprising material which contains 3.0 atomic % or lower of carbon atoms may be present as a transition area 306. The second transitioning area 308 is a silicon oxide comprising material which contains carbon atoms at a concentration ranging from greater than 3.0 atomic % up to the carbon content in the carbon doped silicon oxide low k dielectric layer 309, which contains carbon atoms at a concentration ranging from greater than 3.0 atomic % up to about 12 atomic %. The silicon oxide-comprising material 306, which contains the 3.0 atomic % or lower of carbon atoms, may be present as a transition from a carbon doped silicon nitride barrier layer or from a silicon carbide barrier material present at area 304. The carbon-doped low k silicon nitride barrier material 304 or silicon carbide barrier material (not shown) is found adjacent a semiconductor layer 302 or a conductive layer 310 or 312, where the barrier layer material is used to prevent migration of the conductive material into adjacent layers of material within the semiconductor device structure.

The carbon-doped silicon nitride-comprising barrier layer (or silicon carbide barrier layer), the transitioning silicon oxide-comprising material which contains 3.0 atomic % or lower of carbon atoms, the transitioning silicon oxide comprising material which contains greater than 3.0 atomic % carbon up to as high as about 12 atomic % carbon, and the carbon-doped silicon oxide low k dielectric layers can all be fabricated in the same processing chamber using similar precursor materials, so that device structures can be tailored as desired. A plasma may be maintained during all of the deposition processes which are run in a continuous series, so that all transitions are gradual, without "bumps" up or down in the carbon content of a transitioning material. Further, there need be no definitive layers where there is an interfacial surface which typically exhibits reduced adhesive strength. Using the structure described and a method which produces the structure, it has been possible to consistently obtain flexural strength, Gc, values in the range from 5.9 to 6.6 $J/m^2$. At times the Gc value is sacrificed to some extent to obtain transitional areas which have a reduced thickness. The 5.9-6.6 $J/m^2$ adhesive strength values are a significant improvement when compared with the prior art where the best comparable Gc (4-point flexural testing) values obtained were in the range of 4.0-5.0 $J/m^2$. Based on SIMS data, the thickness of the combination of first and second transitioning layers between the low k barrier layer and the low k dielectric layer may be as low as about 160 Å.

The main focus of the present embodiments of the invention has been on the ramp up and ramp down of particular gas feeds to the film-forming plasma during formation of transitioning materials which transition from a carbon doped low k diffusion barrier material to a subsequently deposited carbon doped low k dielectric material. These transitioning materials were developed because of the poor bonding which occurred when a porous carbon doped low k dielectric layer was deposited over the surface of a carbon doped diffusion barrier layer, for example but not by way of limitation. The transitioning materials are illustrated in FIG. 3 as areas 306 and 308, deposited over carbon doped silicon nitride barrier material 304, and as areas 316 and 318 deposited over carbon doped silicon nitride barrier material 314. Control of the relative gas feeds during deposition of the transitioning materials must enable the formation of smoothly transitioning carbon contents, while providing an acceptable dielectric constant, film thickness, film uniformity and adequate adhesive strength across the entire structure.

The relative gas feed rates and the ramp down or ramp up rates for the dielectric precursor, the porogen precursor and the oxygen reactant gases had been studied previously, as mentioned above with respect to the Edelstein reference. However, a surprising discovery was made during development of the transitioning material areas discussed above. The relative ramp down rates for the helium carrier gas used to transport the silicon precursor and the oxygen reactant gas had a very significant effect on the adhesive strength of the overall structure. (As illustrated by the 4-point adhesive strength testing previously discussed.) The amount of helium carrier gas needs to be rapidly ramped down for purposes of reducing film thickness in the transitional areas while simultaneously increasing the adhesive strength in the transitional areas. A relationship was developed between the ramp down rate of the helium carrier gas and the oxygen reactant gas during formation of the transitional areas which provided unexpected improvement both in reduction of the transitional area film thickness and mechanical strength. Good results can be achieved by ramping down the helium carrier gas even when the oxygen reactant is not ramped down, but flow is discontinued immediately. When this occurs, there is still some residence time where oxygen is present in the processing chamber, and the resultant ratio of the helium ramp down rate to a "default" oxygen ramp down rate is about 3:5 (helium:oxygen). When the helium carrier gas and the oxygen reactant gas are both ramped down, but the ramp down ratio is low, in the range of the 3:5 ramp down ratio, the process provides a combined first and second transitional area thickness (by SIMS) of about 157 Å, and a 4-point adhesion strength of about 5.3 J/m$^2$, while the dielectric constant obtained for the carbon-doped silicon oxide low k dielectric layer was about 2.55. However, better adhesion strength results can be achieved when the ratio of helium ramp down rate to oxygen ramp down rate is in the range of about 60:1. In this instance, a combined transitional area thickness was about 215 Å, and the 4-point adhesive strength was about 6.6 J/m$^2$, while the dielectric constant obtained for the carbon doped silicon oxide low k dielectric layer was about 2.57. While the adhesive strength is improved, the thickness of the combined transitional area is increased. An overall improved result may be obtained by using a ratio of helium ramp down rate:oxygen ramp down rate of about 30:1. In this instance, a transitional area thickness was about 160 Å, and the 4-point adhesive strength was about 5.9 J/m$^2$, while the dielectric constant obtained for the carbon doped silicon oxide low k dielectric layer was about 2.55. This ramp down rate is illustrated in FIG. 4, for example. No plasma arcing occurred over any of the helium carrier gas:oxygen relative ramp down rates discussed above.

Failure to reduce the helium carrier gas flow in the manner described above resulted in a reduction in the adhesive strength of the transitional area (Gc). A Gc obtained when the ramp down ratio of helium:oxygen was 3:5 was 4.8 J/m$^2$, and this is comparable with the known art, where the best Gc obtained ranged from about 4 J/m$^2$ to about 5 J/m$^2$ (when the barrier layer was silicon carbide rather than silicon nitride). The improvement in adhesion strength from 4.8 J/m$^2$ to 6.6 J/m$^2$ obtained by using a rapid helium carrier gas ramp down combined with a relative helium:oxygen ramp down rate during deposition of the combined transitional areas between a carbon-doped diffusion barrier material a carbon doped low k dielectric material was outstanding, and totally unexpected. The recommended relative ramp down rate ratio is from about 60:1 to about 1:2, where higher adhesion strength may be obtained when the ramp down rate ranges from about 60:1 to about 30:1.

BRIEF DESCRIPTION OF THE DRAWINGS

Prior art

FIG. 1B illustrates first interfacial structure 112 in more detail.

Figure 2:
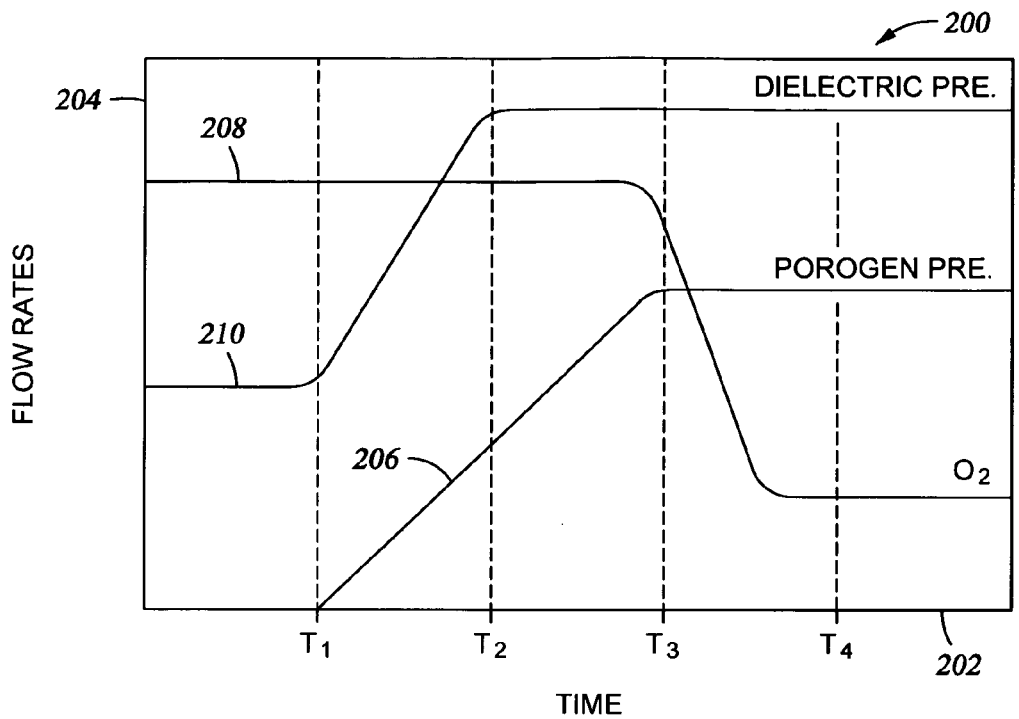

Prior art FIG. 2 relates to PECVD processing of low k dielectric layers, and to relative flow rates for precursors during formation of a carbon doped silicon oxide low k dielectric layer over a surface of a low k diffusion barrier layer.

Figure 3:
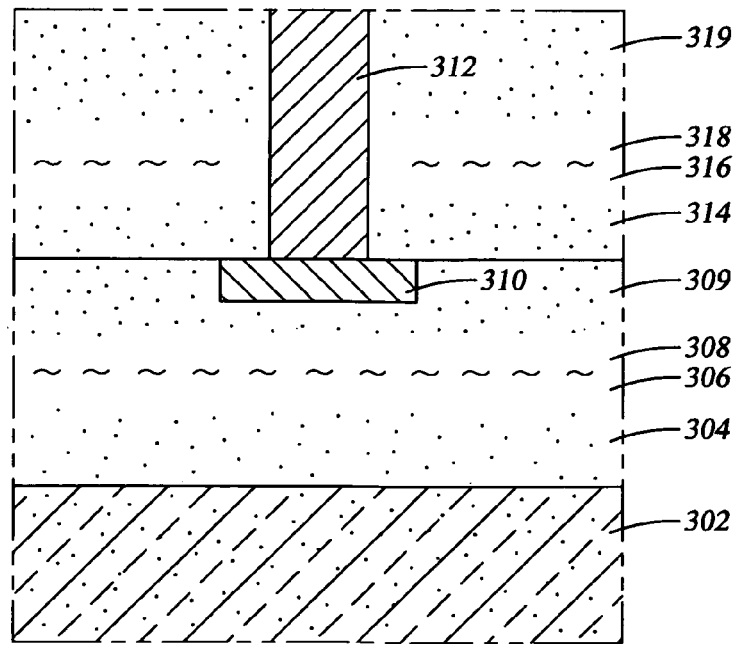

FIG. 3 illustrates a cross-sectional schematic of a semiconductor device structure 300 in accordance with an embodiment of the present invention. Layer 302 represents a silicon substrate. Area 304 represents a carbon doped silicon nitride barrier material which typically contains carbon at an atomic % ranging from at least 3.0 atomic % to about 12 atomic %. Area 306 represents a first transitional area comprising a silicon oxide material which contains 3 atomic % or less of carbon. Area 308 represents a second transitional area comprising 3 atomic % or less of carbon transitioning up to a carbon content which is equal to that of the porous carbon doped silicon oxide low k dielectric layer, where the carbon content may be as high as about 12 atomic %. Area 309 represents a porous carbon doped silicon oxide low k dielectric layer which contains carbon at an atomic % ranging from greater than 3 atomic % to about 12 atomic % of carbon. Layer 310 represents a metallic conductor layer.

Figure 4:
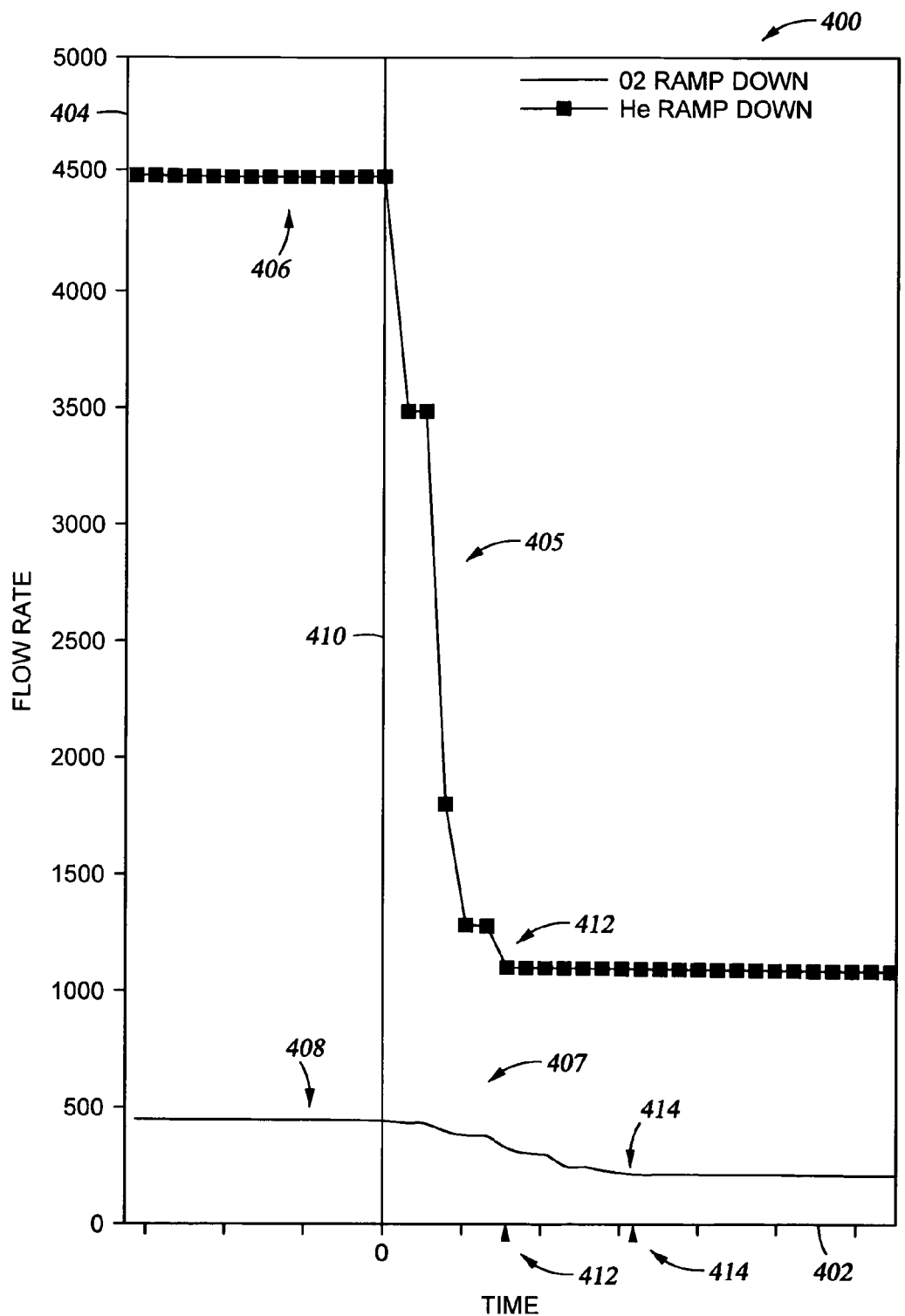

FIG. 4 illustrates an important relationship 400 between a relative flow ramp down rate for a helium carrier gas, as illustrated by curve 405 and an oxygen reagent gas, as illustrated by curve 407. These gases are fed into a PECVD chamber during fabrication of a device of the kind shown in FIG. 3, to transition from area 304 to area 310.

Figure 5:
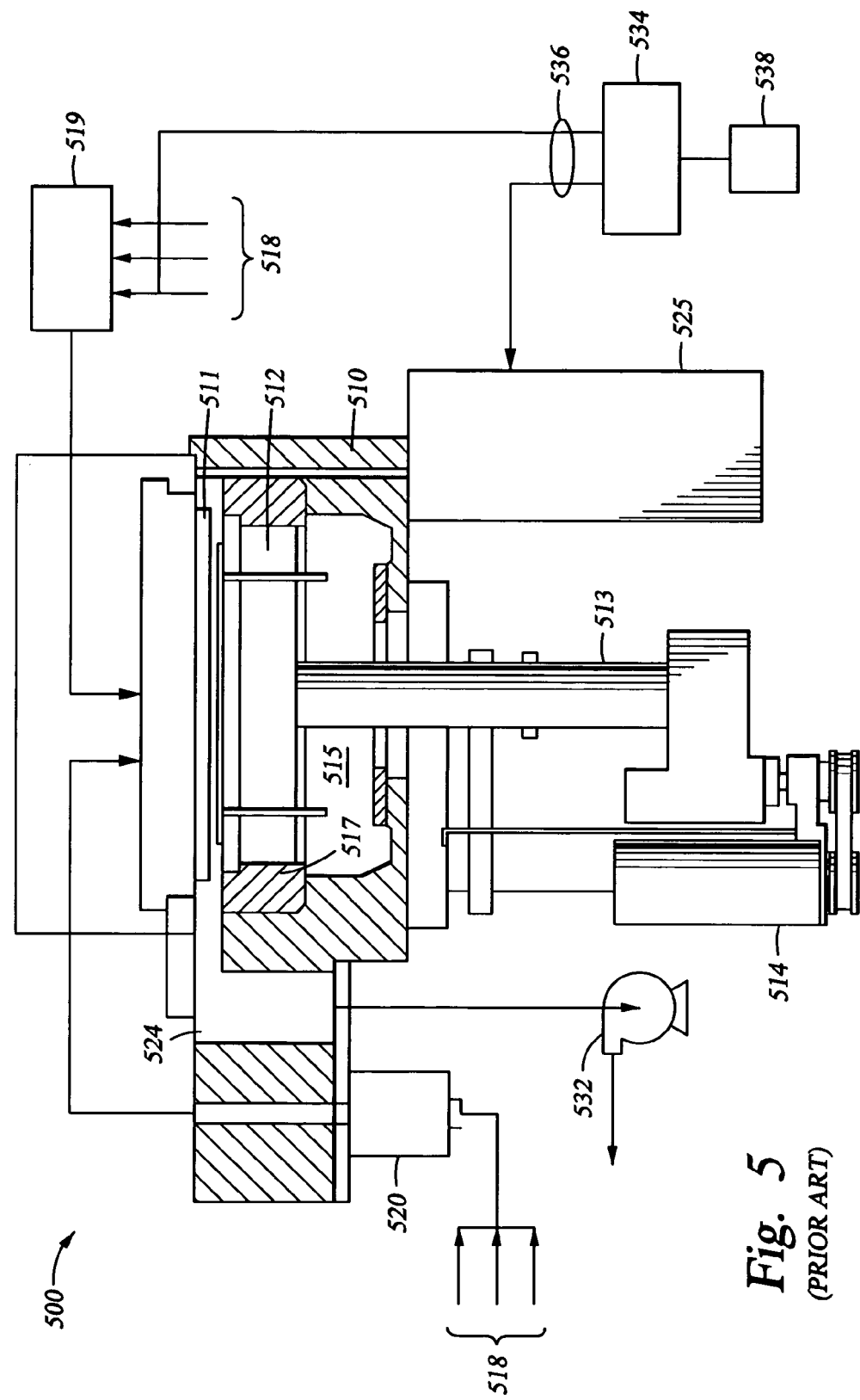

Prior art FIG. 5 shows a cross-sectional schematic of a processing system 500 in which the PECVD reaction to for the various structures described herein may be carried out. A parallel plate plasma enhanced chemical vapor deposition reactor 510 is illustrated in combination with gas input lines 518 for input of carrier and reactant gases to processing chamber 510. A vacuum pump 532 having a throttle valve (not shown) controls the exhaust rate of gases and plasma species from the processing chamber 510.

Figure 6:
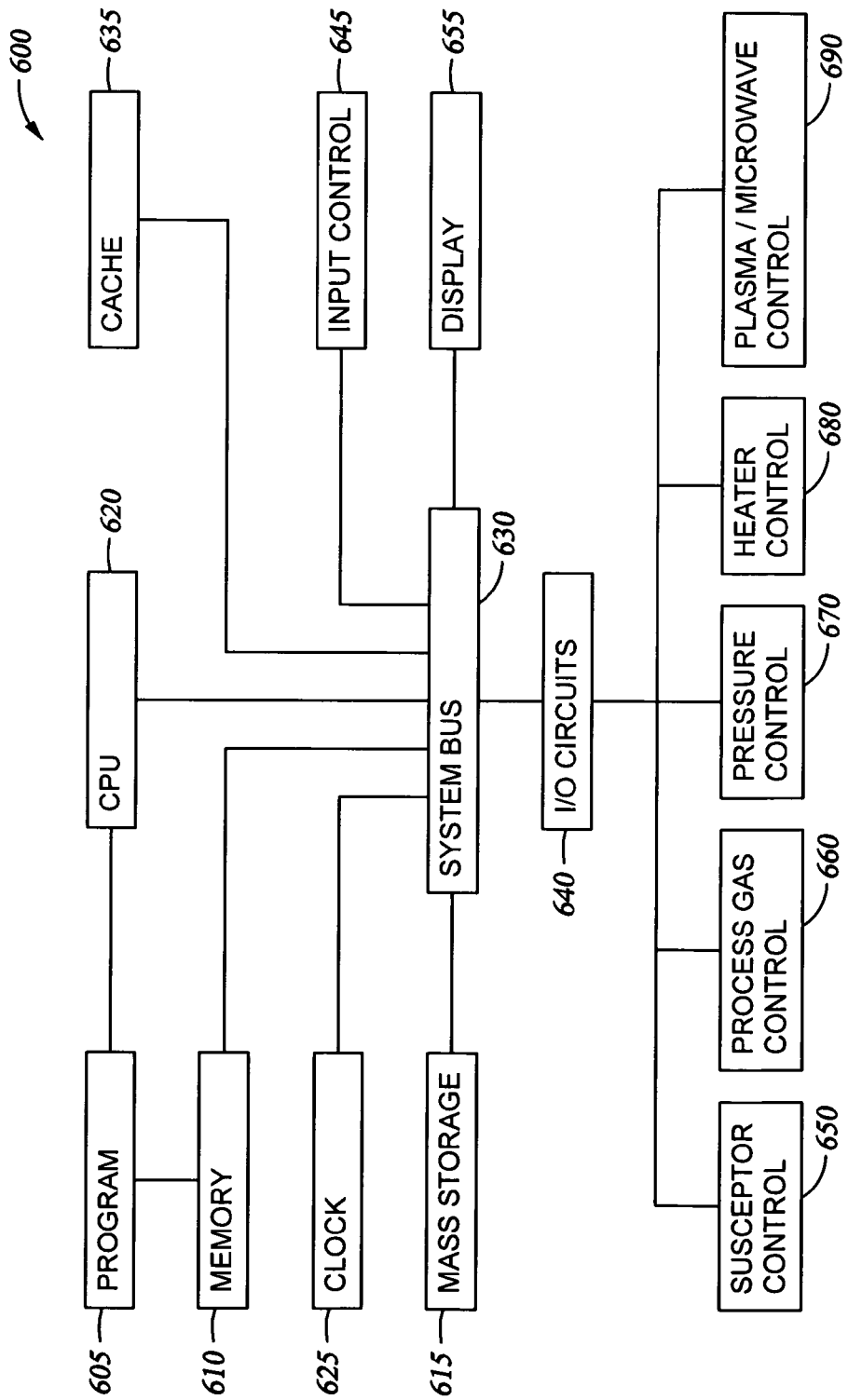

Prior art FIG. 6 shows a block diagram for a system controller 600 which can be used in combination with the processing system 500 which is shown in FIG. 5, to carry out the method of the present invention.

Figure 7:
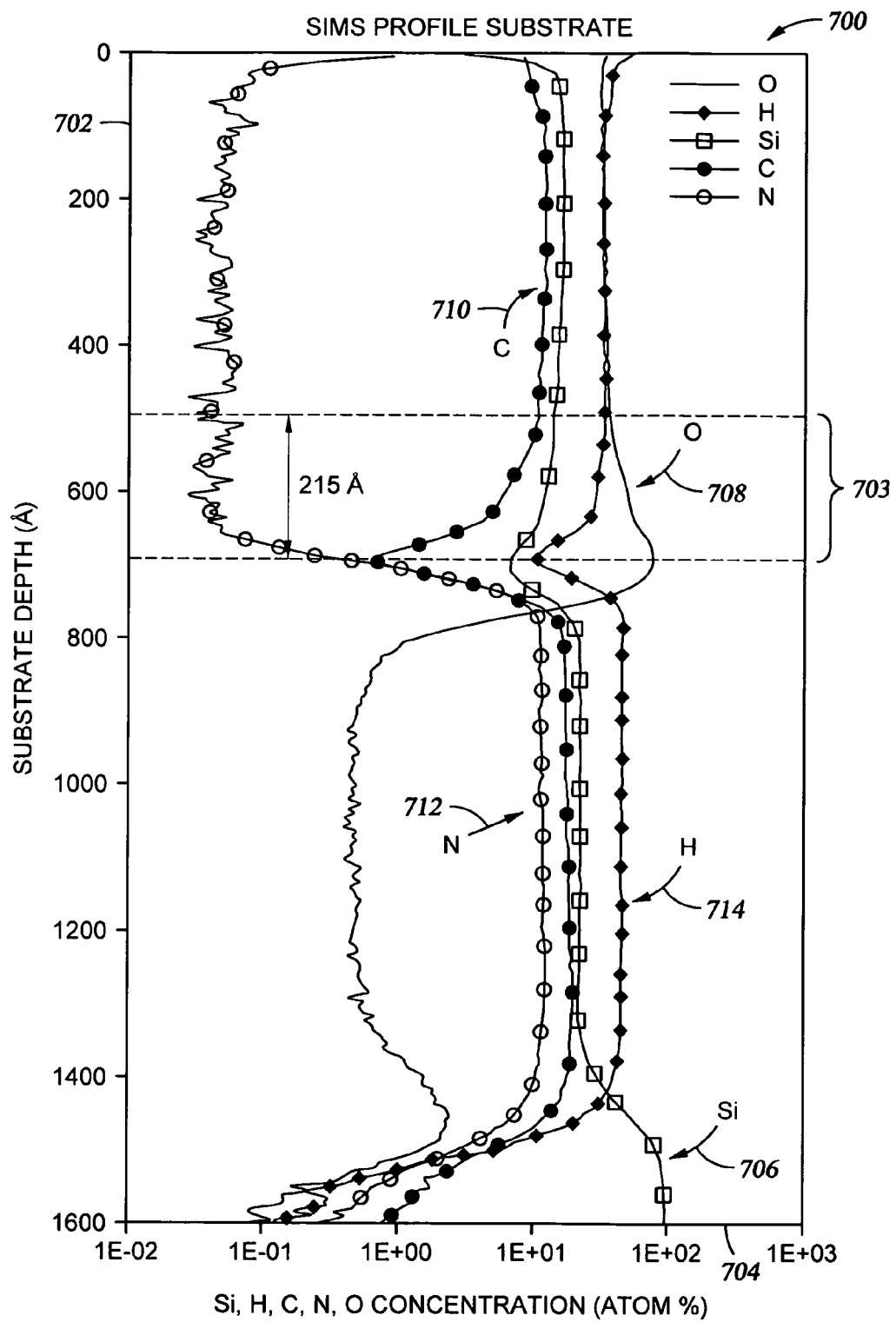

FIG. 7 shows a SIMS Profile 700 for a semiconductor substrate where a portion of the substrate is a transitional film structure which transitions from a carbon doped silicon nitride diffusion barrier layer containing about 12 atomic % carbon to a porous carbon doped silicon oxide low k dielectric with about 10.5 atomic % carbon. The overall thickness of the transitional film was about 215 Å, as illustrated at 703.

Figure 8:
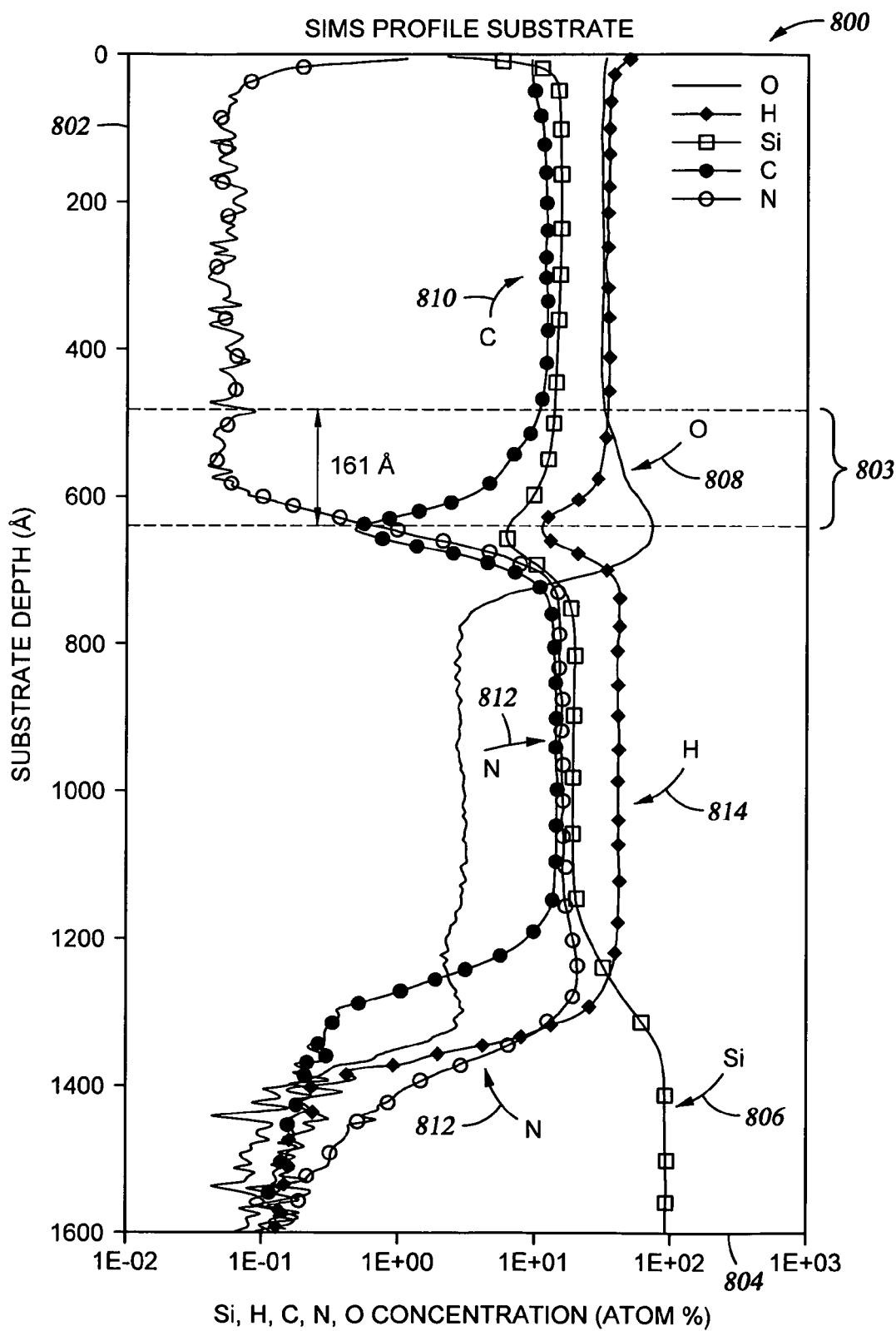

FIG. 8 shows a SIMS Profile 800 for a semiconductor substrate where a portion of the substrate is a transitional film structure which transitions from a carbon doped silicon nitride diffusion barrier layer containing about 12 atomic % carbon to a porous carbon doped silicon oxide low k dielectric with about 10.4 atomic % carbon. The overall thickness of the transitional film was about 161 Å, as illustrated at 803.

Figure 9:
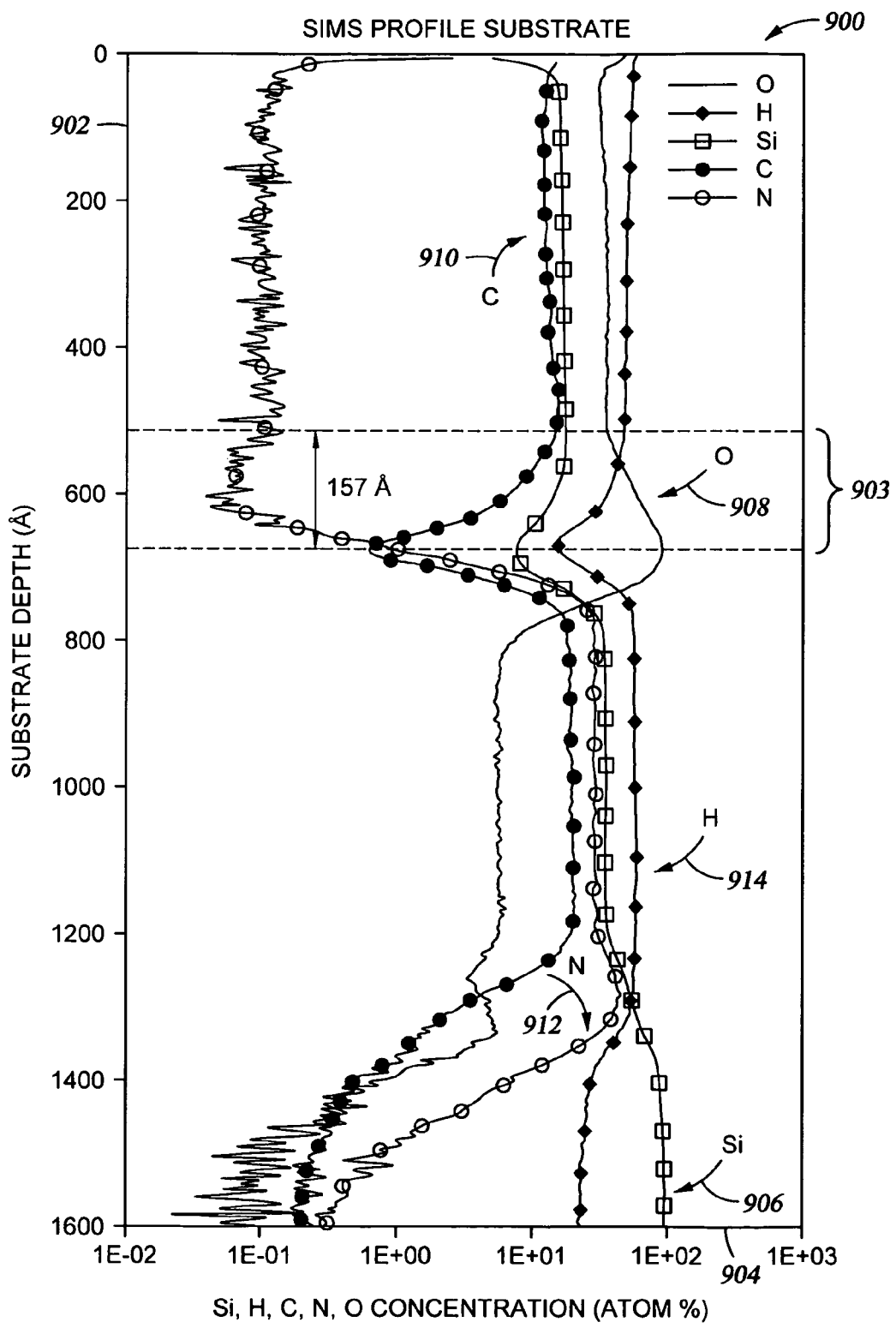

FIG. 9 shows a SIMS Profile 900 for a semiconductor substrate where a portion of the substrate is a transitional film structure which transitions from a carbon doped silicon nitride diffusion barrier layer containing about 12 atomic % carbon to a porous carbon doped silicon oxide low k dielectric with about 10.5 atomic % carbon. The overall thickness of the transitional film was about 157 Å, as illustrated at 903.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

The focus in embodiments of the present invention is on lowering the dielectric constant for dielectric layers to be less than 2.6, and preferably less than 2.5, while achieving structural mechanical strength within the deposited device structure.

In a general embodiment of the present invention, there is a semiconductor device structure which employs at least one carbon doped low k diffusion barrier material which has a carbon content in the range of about 12 atomic %. It is desired to deposit a porous carbon doped low k dielectric material containing greater than 3 atomic % carbon, and typically up to as high as about 12 atomic % carbon over the surface of the diffusion barrier material. To obtain a good flexural/shear strength (or adhesive strength) between these two materials, it is necessary to create a transitional area from the diffusion barrier material to the low k dielectric material. The overall transitional area is a silicon oxide-comprising material which contains 3.0 atomic % carbon or less transitioning up to a carbon doped silicon oxide-comprising material which contains up to about 12 atomic % carbon, and more typically up to about 10 atomic % carbon to 11 atomic % carbon.

With reference to FIG. 3, a silicon oxide-comprising material which contains the 3.0 atomic % or lower of carbon atoms is illustrated as a first transitional areas 306, and a silicon oxide-comprising material which transitions from the 3.0 atomic % carbon or lower up to the carbon doped silicon oxide low k dielectric material which contains 12 atomic % or less carbon is illustrated as a second transitional area 308. The overlying porous carbon-doped low k dielectric material is illustrated as area 309. This same structure is shown in a second illustration where transitional areas 316 and 318 overlie diffusion barrier material 314 and extend upward to overlying porous carbon-doped low k dielectric material 319. The difference between areas 306 and 308, or 316 and 318, respectively, is that area 306 is essentially silicon oxide and area 318 transitions from the silicon oxide up to the carbon content of the overlying layer of porous carbon doped silicon oxide low k dielectric material.

Figure 1A:
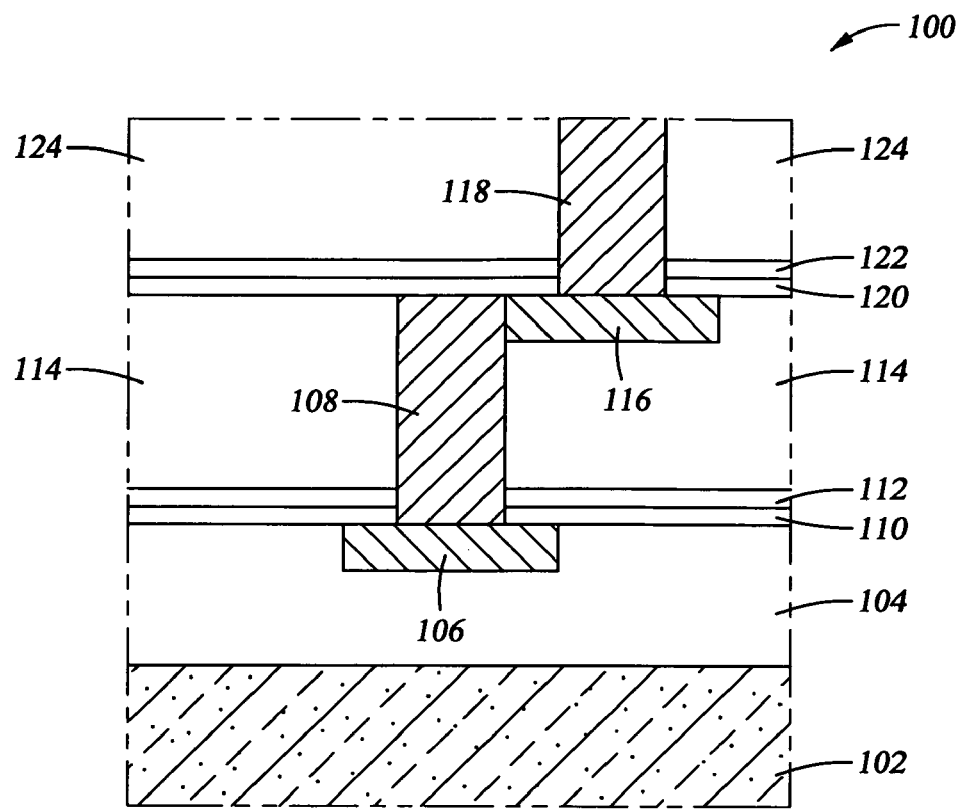
FIG. 1A shows a cross-sectional schematic of a semiconductor device structure 100, where layer 102 represents a silicon substrate, and layer 104 represents a first porous carbon-doped silicon oxide low k dielectric layer. Layer 106 represents a metallization layer. Layer 110 represents a capping layer (barrier layer) used to prevent migration of metal from the metallization layer into overlying carbon doped silicon oxide low k dielectric layer 114. The capping layer 110 shown in this prior art was a silicon carbide based material such as SiCH or Si CHN). Layer 112 represents a dual layer (Illustrated in FIG. 1B) interfacial structure designed to improve adhesion of an overlying carbon doped silicon oxide low k dielectric layer 114 to capping/barrier layer 112.

Prior art FIG. 1A shows a cross-sectional schematic of a semiconductor device structure 100, where the base layer 102 is a silicon layer. Overlying the silicon layer 102 is a layer 104 of a first carbon doped silicon oxide low k dielectric material. This low k dielectric layer contains a first metallization layer 106. Overlying the metallization layer 106 and the upper surface of surrounding low k dielectric material 104 is a barrier/capping layer 110 which is used to prevent migration of metal from the metallization layer 106 into a second carbon doped silicon oxide low k dielectric layer 114 which provides a surface for a second metallization layer 116. Also passing through the low k dielectric layer 114 is a conductive via 108, which is also typically a metal-comprising feature. The capping layers 110 and 120 shown in prior art FIG. 1A are a silicon carbide based material such as SiCH or Si CHN. Overlying the first capping layer 110 is a first interfacial structure 112 designed to improve the adhesion between first capping layer 110 and overlying carbon doped silicon oxide low k dielectric layer 114. Second interfacial structure 122 is designed to improve the adhesion between second capping layer 120 and the second overlying carbon doped silicon oxide low k dielectric 124. Also passing through the second low k dielectric layer 124 is a conductive via 118 which can lead to a third metallization layer in the semiconductor processing device 100.

Figure 1B:
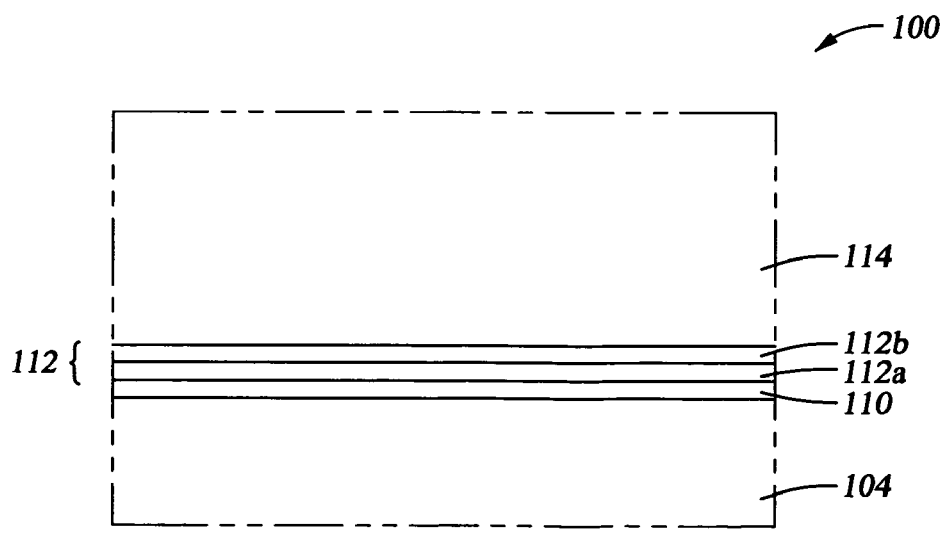
FIG. 1B shows a cross-sectional schematic of a portion of the semiconductor device structure shown in FIG. 1A.

Prior art FIG. 1B illustrates capping first interfacial structure 112 from FIG. 1A, in more detail, showing the dual layer interfacial structure designed to improve adhesion of the second, overlying carbon doped silicon oxide low k dielectric layer 114 to the underlying capping/barrier layer 110. Within the interfacial structure 112 is layer 112a which contains a low carbon content, below 3 atomic % carbon; and layer 112b, which transitions from the low carbon content to a higher carbon content adequate to provide a dielectric constant in the range of about 2.6 or less.

Prior Art FIG. 2, is taken from the Edelstein et al. reference where the figure was labeled FIG. 7. FIG. 7 is said to show the oxygen and the dielectric precursor feed into a PECVD processing chamber for a time T1, usually 1-4 seconds. Helium or argon may be optionally introduced into the processing chamber with the oxygen, according to the description. The process 200 is illustrated by flow rates for various precursors to the processing chamber, as shown in axis 204. Various related time periods are shown on axis 202. The dielectric precursor material (such as an organo silane) feed rate is shown on curve 208, a porogen (of the kind known in the art) flow rate is shown on curve 206, and the oxygen flow rate is shown on curve 208. During formation of a transition layer, a combination of a ramp up of the feed rate of dielectric precursor material 210 and the porogen precursor 206 beginning at T1, and a ramp down of down of the oxygen feed 208 beginning at T3 is said to produce a carbon graded transition layer without the occurrence of carbon peaks or carbon dips. This is discussed in the Edelstein reference in Columns 6-8.

FIG. 3 illustrates a cross-sectional schematic of a semiconductor device structure 300 in accordance with an embodiment of the present invention. Layer 302 represents a silicon substrate. Area 304 represents a carbon doped silicon nitride barrier material which typically contains carbon at an atomic % ranging from greater than about 3 atomic % to about 12 atomic % of carbon. Area 306 represents a transitional area which comprises silicon oxide where the carbon content is less than 3 atomic %. As previously discussed, area 308 represents a transitional area where the carbon content increases as the material is deposited, from the 3 atomic % carbon up to approximately 12 atomic % carbon, and more typically up to about 10 atomic % carbon to 11 atomic % carbon. Area 309 represents a porous carbon doped silicon oxide low k dielectric layer which contains carbon at an atomic % ranging from greater than 3 atomic % to about 11 atomic % carbon. Layer 310 represents a metallic conductor layer. Area 314 represents a second carbon doped silicon nitride low k barrier material which contains greater than 3 atomic % carbon to about 12 atomic % carbon. Area 316 represents a transitional area which contains 3 atomic % or less of carbon. Area 318 represents a transitional area which contains essentially silicon oxide transitioning from less than 3.0 atomic % carbon up to about 12 atomic % carbon. Area 319 represents a carbon doped silicon oxide low k dielectric material which contains carbon at an atomic % ranging from greater than 3 atomic % to about 11 atomic % carbon. Area 312 represents a contact via filled with a metallic conductive material.

FIG. 4 illustrates an important relationship 400 between a relative flow ramp down rate for a helium carrier gas 405 and an oxygen reagent gas 407 which are fed into a PECVD chamber during fabrication of a device of the kind shown in FIG. 3, specifically to transition from area 308 to area 310. In area 308, the material is a silicon oxide dielectric with a carbon content of less than 3 atomic %. In area 310, the material is a carbon doped silicon oxide low k dielectric, where the carbon content ranges from greater than 3 atomic % to about 11 atomic %. Axis 400 of FIG. 4 shows the relative flow rates for the helium carrier gas and the oxygen reactant gas. Axis 402 shows the relative time periods from the beginning 410 of the ramp down of the helium carrier gas feed to the PECVD chamber, as shown in Curve 405; and, from the beginning of the corresponding ramp down of the oxygen reactant gas, as shown by curve 407. The end of the ramp down time period for the helium carrier gas is indicated by point 412, and the end of the ramp down time period of the oxygen reactant gas is illustrated by point 414. The helium carrier gas ramp down rate was about 3,000 sccm/second in the embodiment shown in FIG. 4, while the oxygen reactant gas ramp down rate was about 100 sccm/second.

FIG. 4 is representative of one embodiment of the invention and the flow rates are indicative of one size of process chamber. It is contemplated that other embodiments will make use of different processing apparatus and different flow rates and ramp down rates. What is of importance is the relationship between the helium carrier gas flow rate and the oxygen reactive gas flow rate, the relative ramp down rates of these two gases during formation of the transitional areas discussed above. One of skill in the art of heat and mass transfer will be able to estimate starting rates for the helium carrier gas and the oxygen reactant gas which are necessary to provide the smooth transition in the carbon content of the depositing film, and can arrive at results similar to those described herein after minimal experimentation.

It is also important to mention that the alterations in the helium carrier gas and the oxygen reactant gas flow rates to the PECVD processing chamber are against the back drop of the additional precursor material feeds of the organosilicon compound and compound comprising a source of carbon (a porogen precursor compound, for example) which are used to form the carbon doped silicon oxide low k dielectric material. As these other precursor materials are changed, there may need to be an adjustment made in the ramp down rates of the reactive oxygen compound and the related helium carrier gas which are discussed herein. However, the general concepts of the present invention will remain the same, and one skilled in the art can make adjustments in view of the present disclosure.

The present experimental examples were carried out in a Producer® processing chamber manufactured by Applied Materials, Inc. of Santa Clara, Calif. The Producer® processing chambers (200 mm or 300 mm) have two isolated processing regions that may be used to deposit carbon-doped silicon oxides and other materials. A chamber having two isolated processing regions is described in U.S. Pat. No. 5,855,681 to Maydan et al. issued Jan. 5, 1999, entitled: "Ultra High Throughput Wafer Vacuum Processing System", which is hereby incorporated by reference herein.

The organosilicon compounds used to form the carbon doped silicon oxide-comprising low k dielectric materials of the kind described herein may be selected from the group consisting of tetramethylcyclotetrasiloxane, octamethylcyclotetrasiloxane, pentamethylcyclopentasiloxane, hexamethylcyclotri-siloxane, diethoxymethylsilane, dimethyldisiloxane, tetrasilano-2,6-dioxy-4,8-dimethylene, tetramethyldisiloxane, hexamethyldisiloxane, 1,3-bis(silanomethylene)-disiloxane, bis(1-methyldisiloxanyl)methane, bis(1-methyldisiloxanyl)propane, hexamethosydisiloxane, dimethyldimethoxysilane, and dimethoxymethylvinylsilane, and combinations thereof. These precursor materials are by way of example, and not by way of limitation. The porogen compounds used to form the carbon doped silicon oxide-comprising low k dielectric materials of the kind described herein may be selected from the group consisting of cyclohexadiene, bicycloheptadiene, 1-methyl-4-(1-methyl-ethyl)-1,3-cyclohexadiene, 1-methyl-4-(1-methylethyl)-benzene, alpha-terpinene, 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, 1,4 dioxin, and combinations thereof.

In the development work which produced embodiments of the present invention, the silicon-containing precursor mgm feed rate ranged from about 300 mgm to about 2200 mgm. The porogen feed rate ranged from about 200 mgm to about 3500 mgm. The oxygen flow rate ranged from about 50 sccm to about 3000 sccm. The helium carrier gas flow rate ranged from about 500 to about 5500 sccm. The plasma power applied ranged from about 450 W to about 650 W. The power applied was RF power at a frequency 13.56 MHZ.

In one exemplary combined transitional area forming process, at initiation of the first transitional area, the flow rate of oxygen to the processing chamber was in the range of about 500 sccm, and the flow rate of helium carrier gas to the processing chamber was about 5500 sccm, the typical flow rate of the organosilicon precursor compound was about 300 mg./min. (mgm), and the flow rate of the porogen compound was 200 mgm. As the second translational area was formed, up to the beginning of the formation of the carbon doped low k dielectric layer, the organosilicon precursor flow rate was increased to about 1000 mgm, and the porogen compound precursor flow rate was increased to about 1250 mgm. At the same time, the oxygen feed rate was decreased to about 50 sccm, and the helium carrier gas feed rate was decreased to about 1000 sccm. At the time the bulk deposition of the porous carbon doped silicon oxide low k dielectric began, the silicon precursor helium carrier gas was about 3,000 sccm and the porogen precursor helium carrier gas was about 3,000 sccm, to provide a total helium carrier gas flow of about 6,000 sccm. The amount of RF power applied during film formation ranged from about 650 W at initiation of the first transitional area to about 450 W by the end of transition material and at the start of deposition of the porous carbon doped silicon oxide low k dielectric material. The ramp-up rate for the organosilicon precursor flow rate was about 1000 mgm/second, and for the organic (porogen) precursor flow rate was about 500 mgm/second. The ramp down rate for the helium carrier gas for the organosilicon precursor was about 1000 sccm/sec, and the ramp down rate for the helium carrier gas for the porogen precursor was about 500 sccm/sec. There was no evidence of arcing in the processing chamber during formation of the transition material between the low k barrier material and the carbon doped low k dielectric material. During bulk formation of the carbon doped low k dielectric layer, the silicon precursor helium gas flow typically ranged from about 4,000 to about 5,000 sccm, to provide good film uniformity. The organic (porogen) precursor helium gas flow typically ranged from about 500 to about 2,500 sccm, to provide good film uniformity. This totals about 4,500 sccm to about 7,500 sccm of helium carrier gas.

Prior art FIG. 5 shows a cross-sectional schematic of a processing system 500 in which the PECVD reaction to for the various structures described herein may be carried out. A parallel plate plasma enhanced chemical vapor deposition reactor 510 is illustrated in combination with gas input lines 518 for input of carrier and reactant gases to processing chamber 510. A vacuum pump 532 having a throttle valve (not shown) controls the exhaust rate of gases and plasma species from the processing chamber 510.

The parallel plate chemical vapor deposition reactor 510 has a high vacuum region 515. Reactor 510 contains a gas distribution manifold 511 for dispersing process gases through perforated holes in the manifold to a substrate (not shown) that rests on a substrate support plate or susceptor 512, which is raised or lowered by a lift motor 514. A liquid injection system (not shown), such as typically used for liquid injection of an organosilicon compound may also be provided for injecting a liquid reactant.

The reactor 510 includes heating of the process gases and substrate, such as by resistive heating coils (not shown) or external lamps (not shown). Susceptor 512 is mounted on a support stem 513 so that susceptor 512 can be controllably moved between a lower loading/off-loading position (not shown) and an upper processing position which is closely adjacent to manifold 511.

When susceptor 512 and a substrate are in processing position 514, they are surrounded by an insulator 517 and process gases exhaust into a manifold 524. During processing, gases inlet to manifold 511 are uniformly distributed radially across the surface of the substrate. A vacuum pump 532 having a throttle valve controls the exhaust rate from the chamber. Before reaching manifold 511, deposition and carrier gases are input through gas lines 518 into a mixing system 519 where they are combined and then sent to manifold 511. An optional microwave system (not shown) having an applicator tube 520 may be located on the input gas line for the oxidizing gas, to provide additional energy that dissociates only the oxidizing gas prior to entry to the reactor 110. While the oxidizing gas in the present invention is described as oxygen, it will be understood by one skilled in the art that the oxidizing gas may be an oxygen-containing compound which produces the amount of oxygen described with reference to the method of the present invention. The microwave applicator provides a power from between about 0 and about 6000 W. Generally, the process gases supply lines 518 for each process gas include (i) safety shut-off valves (not shown) that can be used to automatically or manually shut off the flow of process gas into the chamber, and (ii) mass flow controllers (not shown) that measure the flow of gas through the gas supply line. When toxic gases are used in the process, several safety shut-off valves are positioned on each gas supply line in conventional configurations.

The deposition process performed in reactor 510 can be either a non-plasma process on a cooled substrate pedestal or a plasma enhanced process. The method of the present invention made use of a plasma enhanced, PECVD, process. In the PECVD process, a controlled plasma was formed adjacent to the substrate by RF energy applied to distribution manifold 511 from RF power supply 525 (with susceptor 512 grounded). Alternatively, RF power may be provided to the susceptor 512 or RF power may be provided to different components at different frequencies. RF poser supply 525 may supply either a single or mixed frequency RF power to enhance the decomposition of reactive species introduced into the high vacuum region 515. A mixed frequency RF power supply typically supplies power at a high RF frequency (RF1) of about 13.56 MHZ to the distribution manifold 511 and at a low RF frequency (RF2) of about 360 KHz to the susceptor 512. Silicon oxide-comprising layers of the present invention are often produced using low levels or pulsed levels of high frequency RF power. Pulsed RF power preferably provides 13.56 MHZ RF power at about 20 to about 200 W during about 10% to about 30% of the duty cycle. Non pulsed RF power typically 13.56 MHZ RF power is typically applied over a range from about 10 W to about 700 W. Low power deposition frequently occurs at a temperature range from about −20° C. to about 40° C. Over the preferred temperature range, a deposited carbon doped silicon oxide low k dielectric material is partially polymerized during deposition and polymerization is completed during subsequent curing of the film. The transitional materials which are described in embodiments of the invention herein are typically deposited upon a substrate which has been heated to a temperature ranging from about 200° C. to about 400° C. The process chamber pressure during deposition of the transitional materials may range from about 1 to about 10 Torr, but is typically in the range of 7.5 Torr±0.5 Torr. The flow rates of precursor gases into the reactor may vary and are dependent on the chemical and physical make-up of the material which is being deposited. The time periods for deposition of a given transitional material typically range from about 1 second to about 6 seconds. During deposition of the transitional material, frequently, although not absolutely required, a constant chamber pressure is maintained by allowing the throttle valve position to adjust due to a change in process gases flow rates. Frequently, although not absolutely required, the same power levels are maintained during deposition of a given transitional material, to provide a more reproducible film composition and thickness.

Prior art FIG. 6 shows a block diagram for a system controller 600 which can be used in combination with the processing system 500 which is shown in FIG. 5. The system controller 600 includes a programmable central processing unit (CPU) 620 that is operable with a memory 610 and a mass storage device 615, an input control unit 645, and a display unit 655. The memory 610 contains instructions that the CPU 620 executes to facilitate performance of the processing system 500. The CPU 620 forms a general purpose computer that becomes a specific purpose computer when execution programs such as program 605 which may be used to carry out the embodiments of the method of the present invention.

The system controller 600 is coupled to the elements of the processing system employed in the deposition processes in accordance with the present invention via the system bus 630.

and the I/O circuits 640. The I/O circuits 640 receive instructions from the program 605 stored im memory 610 via the CPU 620 and system bus 630. The program 605 provides program subroutines that enable the I/O circuits 640 to provide for substrate/susceptor positioning control 650, process gas control 660, pressure control 670, heater control 680, and plasma microwave control 690 of the reactor.

FIG. 7 shows a SIMS Profile 700 for a semiconductor substrate where a portion of the substrate is a transitional material from a carbon doped silicon nitride-comprising low k barrier layer material (which contains about 12 atomic % carbon) transitioned to a carbon doped silicon oxide low k dielectric material (which contains about 10.5 atomic % carbon). The scale 702 for substrate depth is in Å. The scale 704 for elemental concentrations is in atomic %. The transitional material includes a silicon oxynitride material and a silicon oxide material each of which comprise carbon at a concentration of 3% atomic % or less. The overall thickness of the transitional film was about 215 Å, as illustrated at 703. The transition film was produced using a process in which the helium was ramped down during deposition of the film at a rate of about 3000 sccm/second, and the oxygen was ramped down at a rate of about 50 sccm/second. The adhesion strength of the transition film, as tested by the 4-point bending test was 6.6 J/m$^2$ and the k measured for the carbon doped silicon oxide low k dielectric was 2.57. Curve 706 represents silicon concentration at various substrate depths. Curve 708 represents oxygen concentration at various substrate depths. Curve 710 represents carbon concentration at various substrate depths. Curve 712 represents nitrogen concentration at various substrate depths. Curve 714 represents hydrogen concentration at various substrate depths.

FIG. 8 shows a SIMS Profile 800 for a semiconductor substrate where a portion of the substrate is a transition film from silicon oxide dielectric with 3 less than atomic % carbon to a carbon doped silicon oxide low k dielectric with about 10.4 atomic % carbon. The scale 802 for substrate depth is in Å. The scale 804 for elemental concentrations is in atomic %. The overall thickness of the transition film is about 161 Å, as illustrated at 803. The transition film was produced using a process in which the helium was ramped down during deposition of the film at a rate of about 3000 sccm/second and the oxygen was ramped down at a rate of about 300 sccm/second. The adhesion strength of the transition film, as tested by the 4-point bending test was 5.6 J/m$^2$ and the k measured for the carbon doped silicon oxide low k dielectric was 2.55. Curve 806 represents silicon concentration at various substrate depths. Curve 808 represents oxygen concentration at various substrate depths. Curve 810 represents carbon concentration at various substrate depths. Curve 812 represents nitrogen concentration at various substrate depths. Curve 814 represents hydrogen concentration at various substrate depths.

FIG. 9 shows a SIMS Profile 900 for a semiconductor substrate where a portion of the substrate is a transition film from silicon oxide dielectric with 3 less than atomic % carbon to a carbon doped silicon oxide low k dielectric with about 10.1 atomic % carbon. The scale 902 for substrate depth is in Å. The scale 904 for elemental concentration is in atomic %. The overall thickness of the transition film is about 157 Å, as illustrated at 903. The transition film was produced using a process in which the helium was ramped down during deposition of the film at a rate of 3000 sccm/second and the oxygen was ramped down at a rate of 3000 sccm/second. The adhesion strength of the transition film, as tested by the 4-point bending test was 5.9 J/m$^2$ and the k measured for the carbon doped silicon oxide low k dielectric was 2.55. Curve 806 represents silicon concentration at various substrate depths. Curve 908 represents oxygen concentration at various substrate depths. Curve 910 represents carbon concentration at various substrate depths. Curve 912 represents nitrogen concentration at various substrate depths. Curve 914 represents hydrogen concentration at various substrate depths.

The above described exemplary embodiments are not intended to limit the scope of the present invention, as one skilled in the art can, in view of the present disclosure, expand such embodiments to correspond with the subject matter of the invention claimed below.

We claim:

1. A method of fabricating a microelectronic device structure which includes a diffusion barrier material, a transitional area, and a carbon doped silicon oxide-comprising low k dielectric material, the method comprising:

forming the microelectronic device structure in a plasma enhanced chemical vapor deposition processing chamber, while controlling the flow rates of a combination of gases used to form said transitional area, wherein a flow rate of a helium carrier gas used to transport carbon-comprising reactive gases is ramped down during the formation of said transitional area, wherein a flow rate of an oxygen-comprising gas is also ramped down during the formation of said transitional area, and wherein the relative ramp down rates for said carbon-comprising helium carrier gas and said oxygen-comprising gas have a relationship such that a ratio of a ramp down rate of said carbon-comprising helium carrier gas to a ramp down rate of said oxygen-comprising gas ranges from about 60:1 to about 30:1, wherein oxygen is present at all times during formation of said transitional area, so that an adhesive strength between a deposited transitional area and an overlying or underlying material is improved.

2. A method in accordance with claim 1, wherein said gases which form a plasma during formation of said transitional area in said microelectronic device structure are selected from the group consisting of organosilicon compounds, porogen compounds, an oxygen-containing source, and helium.

3. A method in accordance with claim 2, wherein, during fabrication of said microelectronic device structure, said organosilicon compounds used to form said carbon doped silicon oxide-comprising low k dielectric materials are selected from the group consisting of tetramethylcyclotetrasiloxane, octamethylcyclotetrasiloxane, pentamethylcyclopentasiloxane, hexamethylcyclotri-siloxane, diethoxymethylsilane, dimethyldisiloxane, tetrasilano-2,6-dioxy-4,8-dimethylene, tetramethyldisiloxane, hexamethyldisiloxane, 1,3-bis(silanomethylene)-disiloxane, bis(1-methyldisiloxanyl)methane, bis(1-methyldisiloxanyl)propane, hexamethosydisiloxane, dimethyldimethoxysilane, and dimethoxymethylvinylsilane, and combinations thereof.

4. A method in accordance with claim 3, wherein porogen compounds are added to said organosilicon compounds and are selected from the group consisting of cyclohexadiene, bicycloheptadiene, 1-methyl-4-(1-methyl-ethyl)-1,3-cyclohexadiene, 1-methyl-4-(1-methylethyl)-benzene, alpha-terpinene, 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, 1,4 dioxin, and combinations thereof.

5. A method in accordance with claim 1, or claim 2, or claim 3, or claim 4 wherein said oxygen-comprising gas is selected from the group consisting of $O_2$, $CO_2$, $CO$, $O_3$, $H_2O$, and combinations thereof.

6. A method in accordance with claim 5, wherein said oxygen-comprising gas is $O_2$.

7. A method in accordance with claim 1 or claim 2 wherein a dielectric constant of a carbon-doped silicon oxide layer formed in a transition area ranges from about 2.5 to about 2.6.

8. A method in accordance with claim 1 or claim 2 wherein a 4-point adhesion strength present in a transition area ranges from about 5.0 $J/m^2$ to about 7.0 $J/m^2$.

* * * * *